United States Patent [19]

Minoura et al.

[11] 4,205,347
[45] May 27, 1980

[54] TELEVISION SIGNAL DETERMINATION IN AN AUTOMATIC TUNING SYSTEM

[75] Inventors: Nobuo Minoura, Ohtawara; Isao Matsumura, Yaita; Yasukazu Yoshinaga, Yaita; Takao Abumi, Yaita; Kazuhiro Nakai, Ikoma, all of Japan

[73] Assignee: Sharp Kabushiki Kaisha, Osaka, Japan

[21] Appl. No.: 900,246

[22] Filed: Apr. 26, 1978

[30] Foreign Application Priority Data

Apr. 30, 1977 [JP] Japan ................................ 52-51528
Apr. 30, 1977 [JP] Japan ................................ 52-51531
Sep. 17, 1977 [JP] Japan ............................... 52-112011

[51] Int. Cl.² ............................................. H04N 5/44
[52] U.S. Cl. ............................. 358/191.1; 358/192.1; 358/193.1
[58] Field of Search ....................... 358/191, 192, 193

[56] References Cited

U.S. PATENT DOCUMENTS

| 3,610,817 | 10/1971 | Bridgewater | 358/193 |
| 3,632,864 | 1/1972 | Evans | 358/193 |
| 3,949,164 | 4/1976 | Murakami | 358/193 |

Primary Examiner—Richard Murray
Attorney, Agent, or Firm—Birch, Stewart, Kolasch & Birch

[57] ABSTRACT

A television signal determination circuit is associated with an automatic tuning system, which automatically tunes a television set to local channels, in order to determine whether received signals are desired television signals. The television signal determination circuit comprises a first counter means for counting received synchronizing signals for a predetermined period of time, a second counter means for counting reference clock signals for the predetermined period of time, and a determination means for determining whether the synchronizing signals are received by a predetermined number within the predetermined period of time by comparing output signals from the first and second counter means.

13 Claims, 10 Drawing Figures

TELEVISION SIGNAL DETERMINATION IN AN AUTOMATIC TUNING SYSTEM

BACKGROUND AND SUMMARY OF THE INVENTION

The present invention relates to a television signal determination circuit in an automatic tuning system which automatically tunes a television set to local channels.

It is customary to perform tuning operation in TV receivers while a viewer manually rotates a tuning knob. However, the tuning operation is bothersome in the case of the continuously varying tuning operation as in UHF reception. Though tuning operation is considerably simpler in the case of TV receivers of the recently developed touch control type or remote control type, it is considerably difficult for a non-skilled person to preset the tuner, or to adjust the tuning frequencies for respective broadcasting stations before starting to watch a TV receiver.

Various automatic tuning systems are proposed to simplify the preset tuning operation in TV receivers. However, there is a possibility that the automatic tuning system will erroneously respond to noises rather than desired television signals.

Accordingly, an object of the present invention is to stabilize tuning operation of an automatic tuning system.

Another object of the present invention is to provide a television signal determination circuit for determining whether the received signals are desired television signals.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a television signal determination circuit is provided for determining whether received signals are desired television signals. The television signal determination circuit, in a preferred form, comprises a first counter means for counting received synchronizing signals for a predetermined period of time, a second counter means for counting reference clock signals for the predetermined period of time and a determination means for determining whether the synchronizing signals are received by a predetermined number within the predetermined period of time by comparing output signals from the first and second counter means. When the synchronizing signals are received by the predetermined number within the preceternined period of time, the received signals are considered as the desired television signal.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
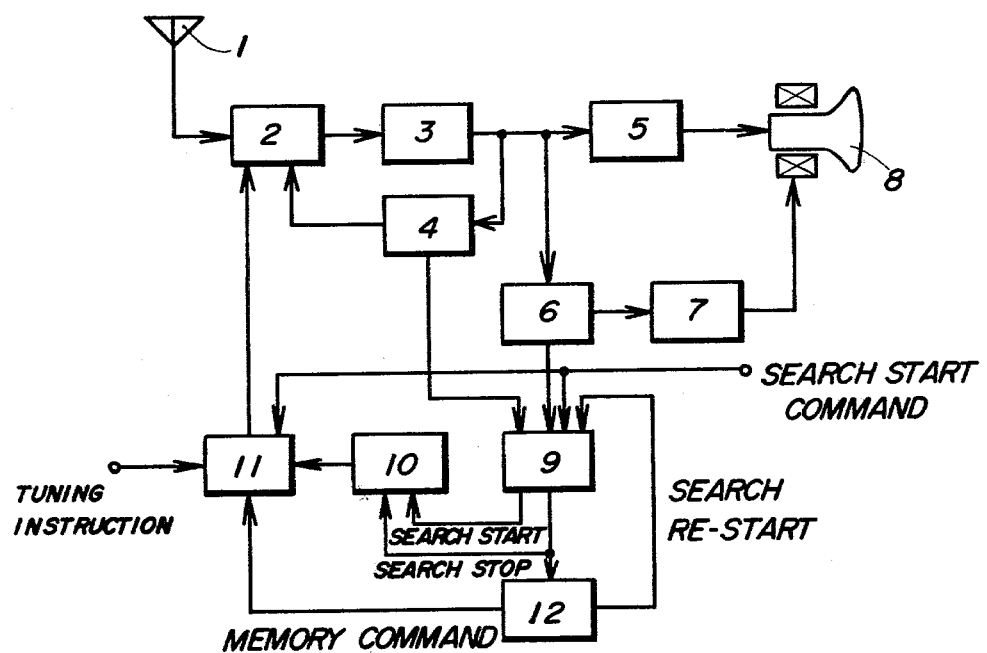
FIG. 1 is a schematic block diagram of an automatic tuning system employing a television signal determination circuit of the present invention.

Referring now in detail to the drawings, and to facilitate an understanding of the present invention, a typical construction of an automatic tuning system will be first described with reference to FIG. 1.

A TV receiver including the automatic tuning system mainly comprises an antenna 1, a tuner 2, an intermediate frequency (IF) circuit 3, an automatic fine tuning (AFT) circuit 4, a video circuit 5, a synchronizing separator 6, a deflection circuit 7, a picture tube 8, a start/stop circuit 9, a tuning voltage generator 10, and a memory circuit 11. A signal determination circuit 12 of the present invention is further provided to determine whether received signals are desired television signals.

It will be noted that the tuner 2 can be implemented with a well known electronic tuning circuit which includes a voltage-sensitive capacitance diode as disclosed in U.S. Pat. No. 3,233,179 entitled "AUTOMATIC FINE TUNING CIRCUIT USING CAPACITANCE DIODES" issued on Feb. 1, 1966.

If the start/stop circuit 9 is given a search start command or an automatic tuning instruction prior to effecting of the preset tuning operation, then the start/stop circuit 9 will develop a search start pulse which in turn is supplied to the tuning voltage generator 10. Under this circumstance the tuning voltage generator 10 develops a sweep voltage or staircase voltage which is gradually rising or dropping during the automatic tuning operation. The sweep or staircase voltage is supplied as the tuning voltage to the tuning capacitance diode in the tuner 2 by way of the memory circuit 11. This implies that the reception frequency in the tuner 2 is gradually varied.

In this way, when the television signal of a specific broadcasting channel is received, the television video signal is derived from the IF circuit 3 and the synchronizing signal from the synchronizing separator 6. The synchronizing signal is applied to the start/stop circuit 9. Meantime, the AFT detector output is derived from the AFT circuit 4 and supplied to the start/stop circuit 9.

More particularly, when the television signal is accurately received, the AFT detector output voltage will change in polarity so that the start/stop circuit 9 is permitted to develop a search stop pulse and the vertical synchronizing signal. In the given example the vertical synchronizing signal may serve as the search stop pulse. The search stop pulse is supplied to the tuning voltage generator 10, barring the generator 10 from developing the sweep or staircase voltage. The voltage then remains constant and is continuously supplied as the tuning voltage to the tuner 2 via the memory circuit 11.

The vertical synchronizing signal derived from the start/stop circuit 9 is supplied to the signal determinating circuit 12 to determine as to whether the signal being received is a normal or true television signal. If the affirmative answer is given, then the signal determination circuit 12 will issue a memory instruction which in turn is supplied to the memory circuit 11 so that the instantaneous tuning voltage derived from the generator 10 is stored within the memory circuit 11.

Contrarily, if a false synchronizing signal is derived from the start/stop circuit 9, then the signal determination circuit 12 reacts to it so that the circuit 12 issues a search re-start pulse. This is supplied to the start/stop circuit 9 to repeat the same procedure as when executing the first search start pulse. The procedure is repeated in this manner until the start/stop circuit 9 derives a true television vertical synchronizing signal or accurate reception is available by the tuner 2.

In other words, the memory instruction is not issued from the signal determination circuit 12 until the optimum reception state is guaranteed. Upon issuance of the memory instruction the instantaneous tuning voltage is stored in the memory circuit 11 and subsequently supplied to the tuner 2.

Once the preset tuning operation (i.e., the presetting of the optimum reception frequency) has been completed for the specific broadcasting channel, the tuning voltage stored in the memory circuit 11 will be automatically supplied to the tuner 2 in response to receipt of a tuning instruction from an operational panel of the known touch control type or remote control type. The searching procedure is thus not required.

It is obvious that the memory circuit 11 shown in FIG. 1 includes a predetermined number of memory elements the number of which corresponds to the number of serviceable broadcasting stations. The same searching or presetting procedure is repeated when it is desired to search and memorize a predetermined number of discrete tuning voltage prior to use of a TV receiver.

Figure 2:
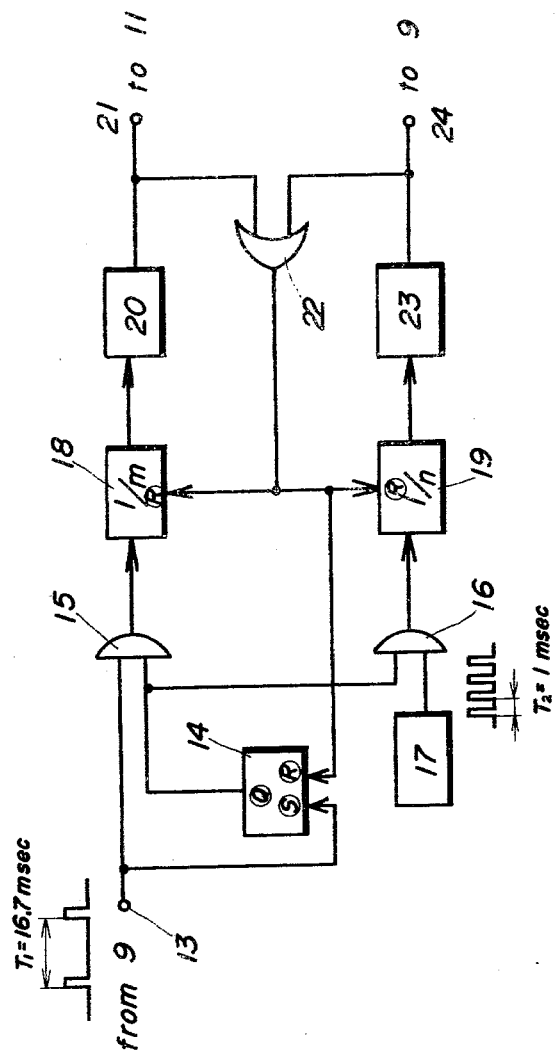
FIG. 2 is a block diagram of an embodiment of a television signal determination circuit of the present invention.

FIG. 2 shows an embodiment of the television signal determination circuit 12 of the present invention.

When a vertical synchronizing signal is applied to an input terminal 13 from the start/stop circuit 9, an R-S flip-flop 14 is set to develop a signal of logic "H" through an output terminal Q. The "H" output is applied to one input terminals of AND gates 15 and 16, respectively. Accordingly, the AND gate 15 passes the vertical synchronizing signal therethrough. And, the AND gate 16 passes a reference clock pulse therethrough derived from a clock pulse generator 17. More specifically, when the vertical synchronizing signal is applied to the input terminal 13, the vertical synchronizing signal is applied to a frequency divider 18 through the AND gate 15, and the reference clock pulses derived from the clock pulse generator 17 are applied to another frequency divider 19.

When the frequency divider 18 has a division ratio 1/m, and the frequency divider 19 has a division ratio 1/n, the frequency divider 18 develops a signal having a pulsewidth $T_1 m$ and the frequency divider 19 develops a signal having a pulsewidth $T_2 n$, respectively. The vertical synchronizing signal has a period $T_1 = 16.7$ msec. The division ratios 1/m and 1/n, and the reference clock pulse period $T_2$ are selected so as to satisfy the following relationship.

$$T_1 m < T_2 n$$

That is, the count operation of the synchronizing signal conducted by the frequency divider 18 is completed before the count operation of the reference clock signal conducted by the frequency divider 19 is completed. When the count operation of the synchronizing signal is completed by the frequency divider 18, an output signal is applied to a mono-stable multivibrator 20 to activate it, whereby a signal having a predetermined pulsewidth is developed toward an output terminal 21. The thus developed signal indicates that normal vertical synchronizing signals are applied to the input terminal 13 and functions as the memory command to be applied to the memory circuit 11. The output signal of the multivibrator 20 is also applied to the reset terminal R of the flip-flop 14, and the frequency dividers 18 and 19 through an OR gate 22. Therefore, the frequency divider 19 does not develop the count completion output. Thus, another mono-stable multivibrator 23 is not activated and, hence, an output signal does not appear at an output terminal 24.

In case where the number of the synchronizing signal is less than the desired number, the frequency divider 19 develops an output signal before the frequency divider 18 develops the output signal. The mono-stable multivibrator 23 is activated to develop an output signal having a predetermined pulsewidth toward the output terminal 24. The thus developed signal indicates that the normal synchronizing signals are not applied to the input terminal 13. The signal derived from the output terminal 24 is applied to the start/stop circuit 9 as the search re-start signal.

The output signal of the multivibrator 23 is also applied to the reset terminals R of the flip-flop 14, and the frequency dividers 18 and 19 through the OR gate 22. The Q output of the flip-flop 14 becomes the logic "L". Therefore, the count operation of the frequency dividers 18 and 19 is terminated.

When the vertical synchronizing signal is again applied to the input terminal 13, the above-mentioned operation is repeated to determine whether the applied signal is a true television signal.

In summary, when the applied signal is the true television signals, the memory command is developed from the output terminal 21. Contrarily, when the false television signals are applied to the input terminal 13, the search re-start signal is developed from the output terminal 24.

In a preferred form, the frequency divider 18 has the division ratio 1/30, the frequency divider 19 has the division ratio 1/600, and the clock pulse generator 17 develops the reference clock pulses of a period 1 msec. The pulsewidth of the output signal derived from the frequency divider 18 is as follows:

$$0.0167 \times 30 = 0.501 \text{ (sec)}$$

The pulsewidth of the output signal derived from the frequency divider 19 is as follows:

$$0.001 \times 600 = 0.6 \text{ (sec.)}$$

The synchronizing signal is not necessarily limited to the vertical synchronizing signal. Other television signals such as the horizontal synchronizing signal, color subcarrier signal and sound carrier signal can be used to conduct the above-mentioned operation.

Figure 3:
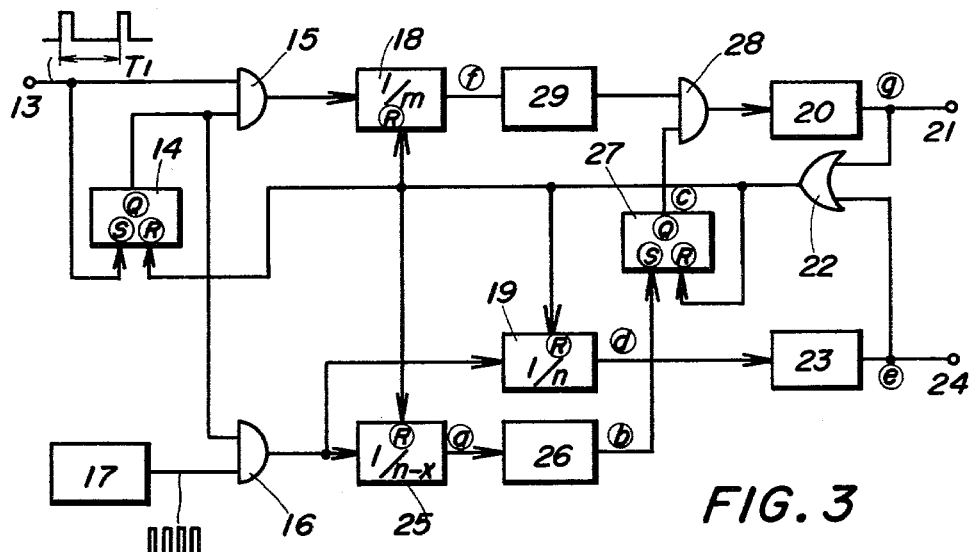
FIG. 3 is a block diagram of another embodiment of a television signal determination circuit of the present invention.

In the embodiment of FIG. 2, there is a possibility that the signal determination circuit detects the false signals as the true television signals if the false signals have a frequency higher than that of the synchronizing signals. FIG. 3 shows another embodiment of the television signal determination circuit 12, which minimizes the above-mentioned erroneous operation. Like elements corresponding to those of FIG. 2 are indicated by like numerals.

The television signal determination circuit of FIG. 3 comprises a frequency divider 25, mono-stable multivibrators 26 and 29, an R-S flip-flop 27, and an AND gate 28 in addition to the elements of the circuit of FIG. 2. The division ratio of the ferquency divider 25 is selected at $1/n-x$, which is slightly larger than that of the frequency divider 19.

Operation of the television signal determination circuit of FIG. 3 will be described with reference to FIG. 4.

When the synchronizing signal is applied to the input terminal 13 at a time $t_0$, the flip-flop 14 is set to develop the output "H" from the Q output terminal. The AND gates 15 and 16 are made conductive. The synchronizing signal is applied to the frequency divider 18 through the AND gate 15, and the reference clock pulses derived from the clock pulse generator 17 are applied to the frequency dividers 19 and 25 through the AND gate 16. Accordingly, the frequency dividers 18, 19 and 25 initiate their count operations.

Figure 4:
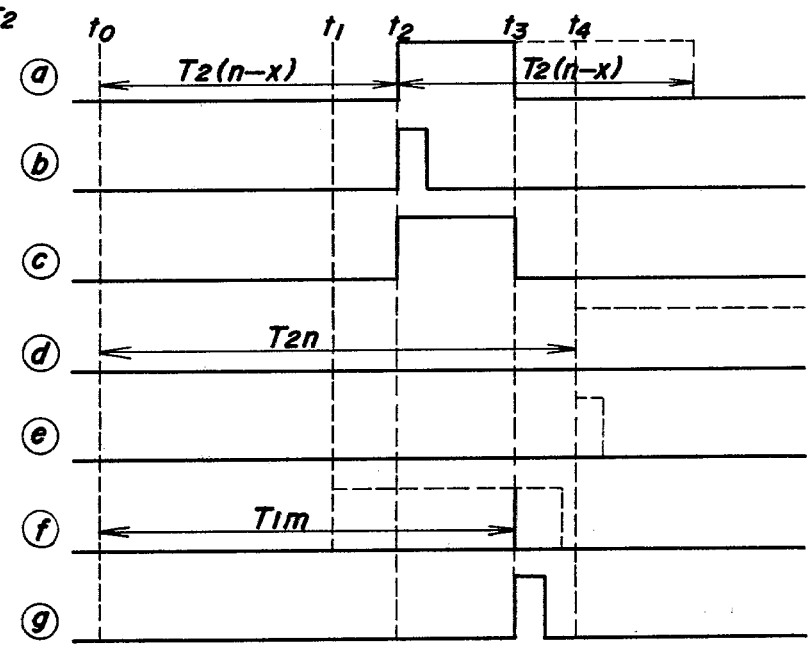
FIG. 4 is a time chart showing various signals occurring within the circuit of FIG. 3.

When the frequency divider 25 counts the reference clock pulses by the $(n-x)$ number at a time $t_2(=T_2(n-x))$, the frequency divider 25 develops the output signal ⓐ as shown in FIG. 4, which is applied to the mono-stable multivibrator 26. Although the output signal has the pulsewidth of $T_2(n-x)$, the pulsewidth is shortened since the frequency divider 25 is reset at a time $t_3$. The mono-stable multivibrator 26 is activated at the leading edge of the output signal of the frequency divider 25, and develops an output signal ⓑ of a predetermined pulsewidth as shown in FIG. 4. The thus developed output signal ⓑ of the multivibrator 26 is applied to the set input terminal S of the flip-flop 27. Accordingly, the Q output ⓒ of the flip-flop 27 takes the logic "H" at the time $t_2$ as shown in FIG. 4.

The reference clock pulses are also applied to the frequency divider 19, which develops an output signal ⓓ at a time $t_4$ after the frequency divider 19 counts the reference clock pulses by the n number as shown by broken lines in FIG. 4. Upon development of the output signal ⓓ from the frequency divider 19, the mono-stable multivibrator 23 develops an output signal ⓔ of a predetermined pulsewidth as shown by broken lines in FIG. 4. The output signal ⓔ of the multivibrator 23 is applied to the reset input terminals R of the flip-flops 14 and 27, and the frequency dividers 18, 19 and 25 through the OR gate 22. However, since the frequency divider 19 is previously reset at a time $t_3$, the frequency divider 19 does not develop the above-mentioned output signal ⓓ. The above mentioned operation will be described in more detail. When the true television vertical synchronizing signals are applied to the input terminal 13, the frequency divider 18 develops an output signal ⓕ at a time $t_3(=T_1m)$ as shown in FIG. 4. The output signal ⓕ of the frequency divider 18 is applied to the mono-stable multivibrator 29 to activate it. The output signal of the mono-stable multivibrator 29 is applied to the mono-stable multivibrator 20 through the AND gate 28. That is, the mono-stable multivibrator 20 is activated at the time $t_3$ to develop an output signal ⓖ as shown in FIG. 4.

The thus developed output signal ⓖ is applied to the reset input terminals R of the frequency dividers 18, 19 and 25, and the R-S flip-flops 14 and 27. That is, the flip-flops 14 and 27, and the frequency dividers 18, 19 and 25 are instantaneously reset at the time $t_3$. Consequently, when the true television signals are applied to the input terminal 13, the memory command is developed from the output terminal 21 at the time $t_3$.

In case where the signals applied to the input terminal 13 have less number than that of the true vertical synchronizing signal, the frequency divider 19 develops the output signal ⓓ at the time $t_4$ before the output signal is developed from the frequency divider 18. Therefore, the search re-start signal is developed from the output terminal 24 at the time $t_4$. Contrarily, when the signals applied to the input terminal 13 have a frequency higher than that of the normal vertical synchronizing signals, the frequency divider 18 develops an output signal ⓕ shown by broken lines in FIG. 4 at a time $t_1$ before the frequency divicer 25 develops the output signal ⓐ. In response to the output signal ⓕ of the frequency divider 18, the multivibrator 29 is activated to develop a pulse signal having a predetermined pulsewidth. At this moment, the flip-flop 27 is in the reset state and, therefore, the pulse signal developed from the multivibrator 29 is not applied to the multivibrator 20. Under these conditions, the frequency divider 19 continues its count operation to develop the output signal ⓓ and the output signal ⓔ at the time $t_4$.

In summary, the television signal determination circuit of FIG. 3 mainly comprises the frequency divider 18 which receives the synchronizing signals and develops a first count output when it counts the synchronizing signals by the number m. The circuit further includes the frequency dividers 25 and 19 which receive the reference clock pulses derived from the clock pulse generator 17 and develop second and third count outputs when they count the reference clock pulses to two different predetermined numbers, respectively. The R-S flip-flop 27 is controlled by the second and third count outputs to develop a delayed pulse of a predetermined pulse width. And the circuit determines whether the first count output is developed within a period of time during which the delayed pulse is developed from the R-S flip-flop 27. When the affirmative answer is given, a first detection output is developed from the output terminal 21. Contrarily, when the affirmative answer is not given, a second detection output is developed from the output terminal 24. The count operation of the frequency dividers 18, 19 and 25 is reset by either one of the first and second detection outputs.

However, in the circuit of FIG. 3, there is a possibility that an output pulse is erroneously developed from the output terminal 21 when, for example, the received signals have a frequency about three times that of the normal vertical synchronizing signal. This is because the frequency divider 18 develops the count output when the Q output of the R-S flip-flop 27 takes the logic "H".

Figure 5:
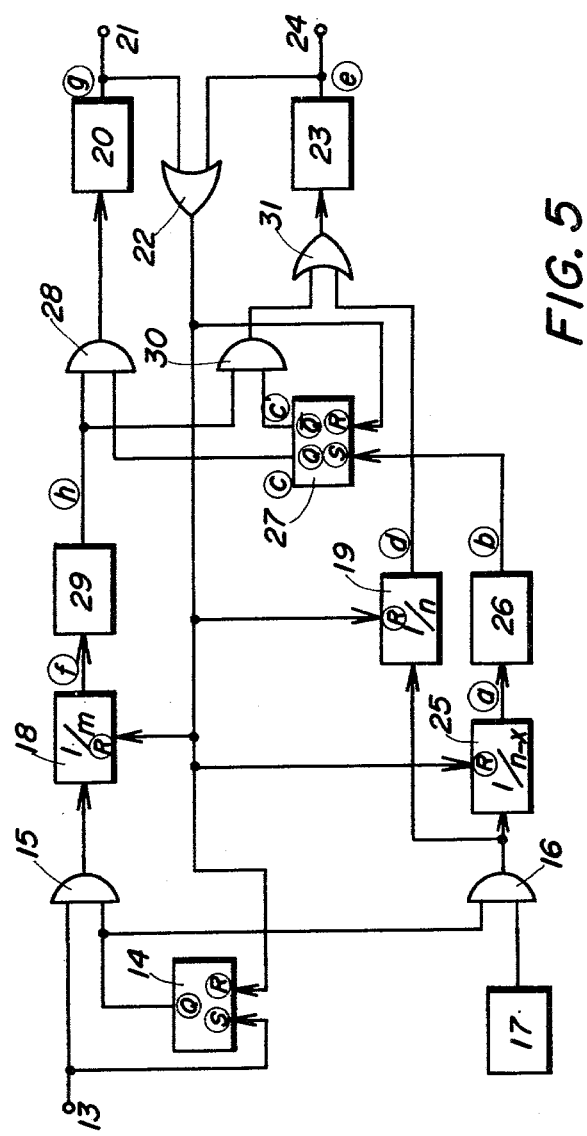
FIG. 5 is a block diagram of still another embodiment of a television signal determination circuit of the present invention.

FIG. 5 shows still another embodiment of the television signal determination circuit 12, which eleminates the above-mentioned erroneous operation. Like elements corresponding to those of FIG. 3 are indicated by like numerals.

The television signal determination circuit of FIG. 5 comprises an AND gate 30 and an OR gate 31 in addition to the elements of the circuit of FIG. 3.

Figure 6:
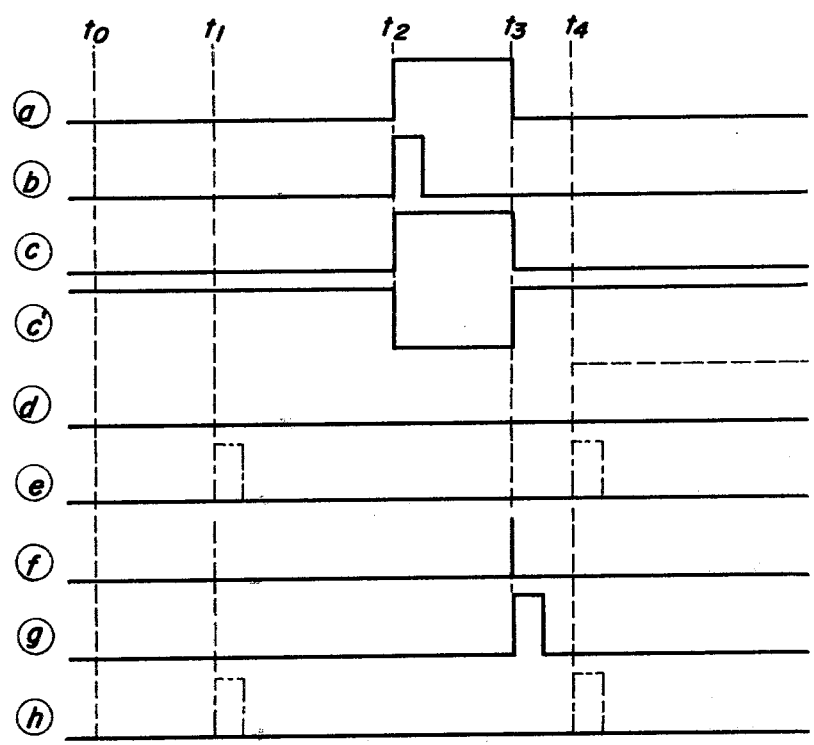
FIG. 6 is a time chart showing various signals occurring within the circuit of FIG. 5.

Operation of the television signal determination circuit of FIG. 5 will be described with reference to FIG. 6.

When the true television vertical synchronizing signals are applied to the input terminal 13, the output signal ⓖ is developed at the output terminal 21 as in the case of the circuit of FIG. 3. When the received signal is less number than that of the true vertical synchronizing signal, the output signal ⓔ is developed at the output terminal 24 as in the case of the circuit of FIG. 3.

When a signal having a frequency higher than that of the normal vertical synchronizing signal is applied to the input terminal 13, an output signal is developed from the frequency divider 18 at, for example, a time $t_1$. Therefore, the mono-stable multivibrator 29 develops an output signal ⓗ as shown by chain lines in FIG. 6. At this moment, the $\overline{Q}$ output of the R-S flip-flop 27 is logic "H" and, therefore, the AND gate 30 is ON. Accordingly, the output signal ⓗ of the multivibrator 29 is applied to the mono-stable multivibrator 23 through the AND gate 30 and the OR gate 31 to activate the multivibrator 23. The multivibrator 23 develops an output signal ⓔ as shown by chain lines in FIG. 6. The thus developed signal ⓔ is applied to the frequency dividers 18, 19 and 25, and to the R-S flip-flops 14 and 27 to reset them.

In summary, in the circuit of FIG. 5, when the output pulse is developed from the frequency divider 18 at a time where the $\overline{Q}$ output of the R-S flip-flop is logic "H", the search re-start signal is developed from the output terminal 24 and the circuit is reset. The synchronizing signal is not necessarily limited to the vertical synchronizing signal. Other television signals such as the horizontal synchronizing signal, color subcarrier signal and sound carrier signal can be used to conduct the abovementioned operation.

Figure 7:
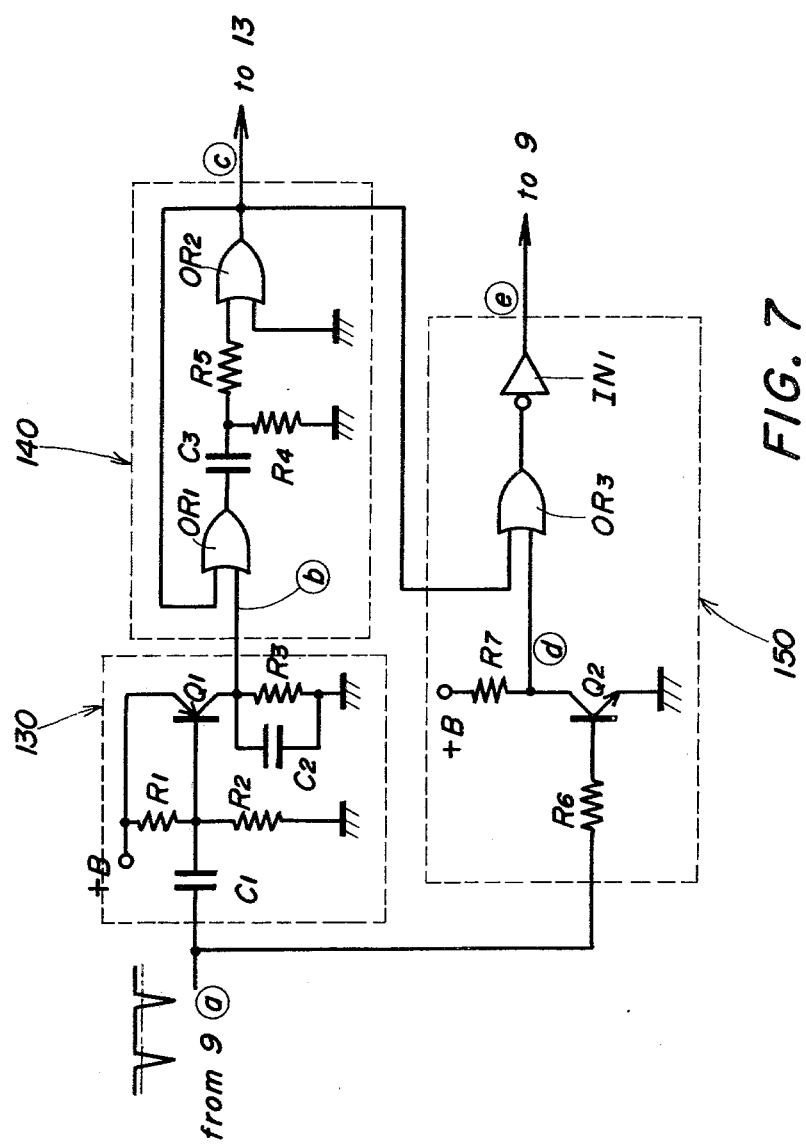
FIG. 7 is a circuit diagram of an embodiment of synchronizing signal waveform shaping circuit for shaping synchronizing signals to be applied to the television signal determination circuit.
Figures 8, 9:
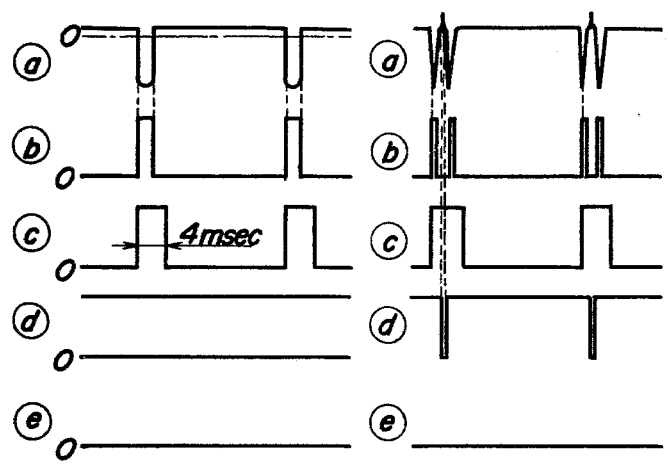
FIGS. 8 through 10 are time charts for explaining operation of the synchronizing signal waveform shaping circuit of FIG. 7.

In the foregoing embodiments, the circuit will erroneously count two when the vertical synchronizing signal applied to the determination circuit has a sag as shown in FIG. 9 ⓐ. FIG. 7 shows an example of a synchronizing signal waveform shaping circuit for shaping the synchronizing pulses to preclude the abovementioned erroneous operation.

The waveform shaping circuit of FIG. 7 mainly comprises a synchronizing signal amplifier 130, a one-shot pulse generator 140 and a noise detection circuit 150. The synchronizing signal amplifier 130 includes a transistor $Q_1$, resistors $R_1$, $R_2$ and $R_3$, and capacitors $C_1$ and $C_2$. The one-shot pulse generator 140 includes OR gates $OR_1$ and $OR_2$, resistors $R_4$ and $R_5$, and a capacitor $C_3$. The noise detection circuit 150 includes a transistor $Q_2$, resistors $R_6$ and $R_7$, an OR gate $OR_3$, and an inverter $IN_1$.

Operation of the waveform shaping circuit of FIG. 7 will be described with reference to FIGS. 8, 9 and 10.

When a vertical synchronizing signal ⓐ as shown in FIG. 8 is applied to the base electrode of the transistor $Q_1$ of the synchronizing signal amplifier 130 from the start/stop circuit 9, the synchronizing signal is amplified and developed through the collector electrode of the transistor $Q_1$, the output waveform being shown as ⓑ in FIG. 8. The thus developed output signal ⓑ of the synchronizing signal amplifer 130 is applied to the one-shot pulse generator 140, which shapes the synchronizing signal to have a pulsewidth of about 4 msec as shown in FIG. 8 ⓒ. The thus shaped synchronizing signal ⓒ is applied to the input terminal 13 of the television signal determination circuit 12.

On the other hand, when a synchronizing signal ⓐ having a sag as shown in FIG. 9 is applied to the synchronizing signal amplifier 130, the transistor $Q_1$ develops two pulses ⓑ for one synchronizing signal as shown in FIG. 9. The thus developed pulses ⓑ are applied to the one-shot pulse generator 140, which develops one pulse ⓒ for each two pulses ⓑ as shown in FIG. 9. Accordingly, the frequency divider 18 (see FIGS. 2, 3 and 5) receivers one pulse for each one cycle of the synchronizing signal.

Figure 10:
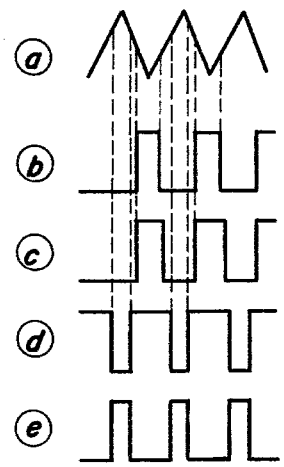

When a noise ⓐ as shown in FIG. 10 is applied from the start/stop circuit 9, the transistor $Q_2$ is ON and develops an pulse output ⓓ as shown in FIG. 10 due to the positive components of the noise ⓐ. The transistor $Q_2$ is in the cut-off state as long as the normal synchronizing signal is applied from the start/stop circuit 9. The output pulses ⓒ and ⓓ are applied to the OR gate $OR_3$ and, therefore, the inverter $IN_1$ develops a pulse signal ⓔ as shown in FIG. 10. The thus developed pulse signal ⓔ is fed back to the start/stop circuit 9 as the search re-start command.

In case where the synchronizing signal ⓐ having a sag as shown in FIG. 9 is applied from the start/stop circuit 9, the transistor $Q_2$ develops a pulse ⓓ as shown in FIG. 9 since the synchronizing signal includes the positive component pulse. However, the output ⓒ of the one-shot pulse generator 140 takes the positive level while the pulse ⓓ is developed from the transistor $Q_2$ and, therefore, the search re-start command is not developed.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A television signal determination circuit in an automatic tuning system comprising:
   a first counter means for counting the number of received synchronizing signals;
   a reference clock signal generator for developing reference clock pulses of a predetermined frequency;
   a second counter means for counting said reference clock pulses derived from said reference clock signal generator;
   count operation control means for initiating count operations of said first and second counter means at the same time upon receiving the synchronizing signal; and a determination means for comparing contents of said first and second counter means and developing a signal determination output representing whether received signals are the true television synchronizing signal.

2. The television signal determination circuit of claim 1, wherein:
said first counter means comprises a frequency divicer for developing a first count output upon counting said synchronizing signal by a preselected number; said second counter means comprises a frequency divider for developong a second count output upon counting said reference clock pulses by a predetermined number; and said determination means detects whether said first count output appears before said second count output.

3. The television signal determination circuit of claim 1 or 2, wherein said synchronizing signal comprises a vertical synchronizing signal.

4. The television signal determination circuit of claim 1 or 2, wherein said synchronizing signal comprises a horizontal synchronizing signal.

5. A television signal determination circuit in an automatic tuning system comprising: a first counter means for counting the number of received synchronizing signal and developing a first count output when the count number reaches a preselected number; a clock pulse generator for developing a reference clock pulse signal;
a second counter means for counting said reference clock pulse signal derived from said clock pulse generator and developing a second count output when the count number reaches a predetermined number;
count control means for initiating count operation of said second counter means in synchronization with count operation of said first counter means;
a delayed pulse generator means for developing a delayed pulse of a predetermined pulsewidth in response to development of said second count output from said second counter means;
a first control signal generation means for developing a first control signal when said first count output is sensed while said delyaed pulse is developed from said delayed pulse generation means;
a second control signal generation means for developing a second control signal when said first count output is not sensed while said delayed pulse is developed from said delayed pulse generation means; and
reset means for resetting count operation of said first and second counter means in response to said first and second control signals.

6. The television signal determination circuit of claim 5, wherein said first and second counter means comprise frequency dividers, respectively.

7. The television signal determination circuit of claim 5, wherein said delayed pulse generation means comprises a frequency divider and an R-S flip-flop.

8. The television signal determination circuit of claim 5, 6 or 7, wherein said synchronizing signal comprises a vertical synchronizing signal.

9. The television signal determination circuit of claim 5, 6 or 7, wherein said synchronizing signal comprises a horizontal synchronizing signal.

10. The television signal determination circuit of claim 1, 2, 5, 6 or 7, which further comprises a waveform shaping circuit for shaping said received synchronizing signal to be applied to said first counter means.

11. The television signal determination circuit of claim 10, wherein said waveform shaping circuit comprises a one-shot pulse generator responsive to said synchronizing signal.

12. A television signal determination circuit in an automatic tuning system including a vertical synchronization signal comprising:
counter means for counting the number of received vertical synchronization signals; and
determination means for determining whether a preselected number of vertical synchronization signals are counted by said counter means in a predetermined time.

13. A television signal determination circuit in an automatic tuning system including a horizontal synchronization signal comprising:
counter means for counting the number of received horizontal synchronization signals; and
determination means for determining whether a preselected number of horizontal synchronization signals are counted by said counter means in a predetermined time.

* * * * *